United States Patent [19]

Mori et al.

[11] Patent Number: 4,960,495

[45] Date of Patent: Oct. 2, 1990

[54] PROCESS FOR PRECISE PROCESSING OF WORKPIECE USING FREE RADICALS

[75] Inventors: Yuzo Mori, Katano; Kazuto Yamauchi, Suita, both of Japan

[73] Assignee: Mikakto Precision Engineering Research Institute Co., Ltd., Osaka, Japan

[21] Appl. No.: 211,184

[22] Filed: Jun. 24, 1988

[30] Foreign Application Priority Data

Jun. 26, 1987 [JP] Japan ................. 62-160760

[51] Int. Cl.⁵ .................. B23H 7/02; B23H 7/12; B23H 7/38; B23H 9/14
[52] U.S. Cl. .................. 204/129.3; 204/129.46; 204/129.55; 156/643; 156/646
[58] Field of Search ................ 156/643, 646; 204/129.3, 129.46, 129.55, 129.35, 192.34, 192.32

[56] References Cited

U.S. PATENT DOCUMENTS

| | | | |
|---|---|---|---|
| 4,409,075 | 10/1983 | Kolbesen | 204/129.46 X |
| 4,411,733 | 10/1985 | Macklin et al. | 204/192.34 X |
| 4,448,656 | 5/1984 | Kuromatsu | 204/129.46 X |
| 4,529,475 | 7/1985 | Okano et al. | 204/192.34 |
| 4,559,115 | 12/1985 | Inoue | 204/129.46 X |
| 4,615,756 | 10/1986 | Tsujii et al. | 156/646 X |
| 4,624,736 | 11/1986 | Gee et al. | 156/646 X |
| 4,687,539 | 8/1987 | Burns et al. | 156/646 X |
| 4,713,141 | 12/1987 | Tsang | 156/643 |
| 4,738,748 | 4/1988 | Kisa | 156/643 |
| 4,749,440 | 6/1988 | Blackwood et al. | 156/646 |
| 4,751,779 | 6/1988 | Nagatomo et al. | 156/646 X |
| 4,767,495 | 8/1988 | Nishioka | 156/646 X |
| 4,772,368 | 9/1988 | Rabian | 204/212 X |

Primary Examiner—Donald R. Valentine
Attorney, Agent, or Firm—Armstrong, Nikaido, Marmelstein, Kubovcik & Murray

[57] ABSTRACT

The invention relates to a precision process, wherein a radical reaction of a radical produced from a gas on discharge or laser beam excitation in a gaseous atmosphere with an atom or molecule constituting a workpiece is utilized, a compound produced according to the reaction is vaporized and removed, and thus a workpiece such as silicon single crystal, ceramics material or the like can be smoothed, cut, bored, grooved and so forth without leaving a residual defect such as residual crack, thermally affected layer of the like on the surface.

9 Claims, 7 Drawing Sheets

PROCESS FOR PRECISE PROCESSING OF WORKPIECE USING FREE RADICALS

BACKGROUND OF THE INVENTION

1. Field of the Invention:

This invention relates to a strainless precision process on radical (free radical) reaction and, more particularly, to a precision process ensuring strainless cutting, boring and grinding of brittle materials hard to work such as silicon and germanium single crystal for manufacturing semiconductors, gallium-arsenic compound, various ceramics materials or the like.

2. Description of the Prior Art:

A prior art precision process, or cutting for example, of brittle materials hard to work such as silicon and germanium single crystal for manufacturing semiconductors, gallium-arsenic compound, various ceramics materials or the like depends only on dicing on a diamond wheel, and since its working principle comprises a brittle fracture by fine cracking, a serviceable surface will not be secured due to residual cracks unless the cut face is removed about 100 μm in thickness on the average. Further, the brittle fracture due to cracks is rather probable and a considerably large crack may remain according to circumstances, which is capable of deteriorating the reliability of an obtained surface. Thus, the cut face of a workpiece must be removed at about 100 μm in thickness, for which lapping is employed, however, since its working principle also comprises a brittle fracture, a residual affected layer is rather deep while not so heavy as compared with the aforementioned dicing, and thus an after-treatment such as etching, polishing or the like is further required. Then, lapping is also carried out for grinding the surface of a workpiece, however, the lapping is realized by transferring the flatness of a lapping tool to the workpiece, and since it depends in this case on a brittle fracture likewise according to a conventional process using a grade, both surface roughness and surface property are not to withstand the final purpose. Further, the prior art process is that of utilizing a thermal fusion phenomenon on laser for boring, grooving and so forth, therefore a thermal affected layer or a residual crack arsing on thermal stress is present on a finished surface. Thus in the prior art process, not only a residual crack and a thermal affected layer are present on the finished surface, but also a finished portion is removed so much, therefore yield of a workpiece is high, and further a production process increases in number, thus preventing a cut in cost of semiconductors and others using expensive silicon and germanium single crystal, or gallium-arsenic compound.

SUMMARY OF THE INVENTION

In view of the situation mentioned above, an object of the invention is to provide a strainless precision process on radical reaction, wherein defects such as residual crack, thermal affected layer and the like which are capable of deteriorating a reliability of products are not left on the surface of a workpiece, still further lapping, or a work for removing the workpiece surface at about 100 μm or over in thickness is not required as an after-treatment unlike the prior art process, thus not only the post-process is considerably simplified, but also the workpiece can be utilized effectively.

In order to attain the aforementioned object, the invention provides a strainless precision process on radical reaction, which comprises activating a gas selectively by discharge or laser beam excitation in the vicinity of a workpiece disposed in a gaseous atmosphere, vaporizing a compound produced according to a radical reaction with atom or molecule constituting the workpiece, thereby processing the workpiece.

The strainless precision process on radical reaction according to the invention as above is that in which a gas in the vicinity of a portion to work of a workpiece disposed in a gaseous atmosphere is activated selectively by discharge or laser beam excitation to generate a radical with high reactivity, a compound produced according to a reaction of the radical with atom or molecule constituting the workpiece is vaporized and thus removed from the portion to work, thereby cutting, smoothing, boring and grooving the workpiece which is hard to work.

Other object, features and advantages of this invention will become apparent from the following description, the appended claims and the accompanying drawings.

BRIEF DESCRIPTION OF THE DRAWINGS

FIG. 14 is a simplified side view showing a gear cutting by means of a gear-toothed electrode.

DETAILED DESCRIPTION OF PREFERRED EMBODIMENTS

The invention comprises carrying out a strainless precision process through a radical reaction (free radical reaction) of a reactive radical (free radical) having an unpaired electron with atom or molecule constituting a workpiece.

Here, as a method for generating a radical, it is conceivable that a plasma which can easily be produced by discharge at a degree of vacuum 1 Torr or below ($10^{-3}$ to 1 Torr) will be utilized, however, since a density of the plasma thus produced is low and the working rate is slow, a high density plasma condition is generated for process by vibrating a charged corpuscle in a high frequency field under high pressure 1 atm. or over in the invention, and a radical generated by DC discharge or laser beam irradiation may be used otherwise.

More specifically, the strainless precision process is carried out such that a workpiece of a brittle material hard to work such as silicon and germanium single crystal for manufacturing semiconductors, gallium-arsenic compound, various ceramics materials or the like is disposed in an atmospheric gas such as chlorine ($Cl_2$), fluorine ($F_2$) or the like, a DC voltage or high frequency voltage is impressed between a workpiece of conductor and an electrode of material relatively high in reaction temperature with a chloride gas such as tungsten (W), platinum (Pt) or the like which is disposed a little apart from the workpiece, a high frequency voltage is impressed between the aforementioned electrode and another electrode disposed in the vicinity of the work piece of insulator, a discharge is caused near the surface of the workpiece to generate a radical reactive chemically from the atmospheric gas, then a radical is generated from irradiating laser beams oscillated by solid laser, gas laser and liquid laser to the gas present near the surface of the workpiece of conductor or insulator, and in case, for example, silicon is used as the workpiece and a chloride gas is used as the gas, a radical reaction is caused on the surface of a working portion of the silicon to generate a silicon chloride, and the silicon chloride is vaporized and removed at ordinary temperature or at 200° C. or below.

Figure 1:
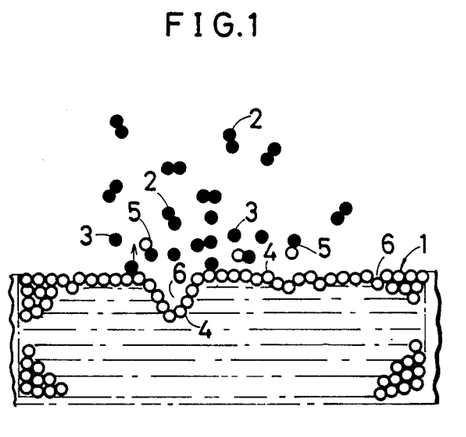
FIG. 1 is a sectional view illustrating a principle of a strainless precision process on radical reaction according to the invention.

The invention will now be described further in detail with reference to the accompanying drawings representing preferred embodiments thereof. FIG. 1 illustrates the principle of a process of the invention, wherein a reference numeral 1 denotes a workpiece, 2 denotes a gas molecule, 3 denotes a radical (free radical), 4 denotes a constituent atom or molecule of the workpiece 1, and 5 denotes a compound. The radical 3 is produced by subjecting the gas molecule 2 to discharge or laser beam excitation near the surface of the workpiece 1 disposed in the atmospheric gas 2, the compound 5 capable of vaporizing at relatively low temperature is produced on reaction of the radical 3 with the constituent atom or molecule 4 of the workpiece 1, the compound 5 is vaporized by warming up the workpiece 1 to a set temperature relatively low or, for example, 200° C. or below on ordinary temperature or heater or the like (not indicated), thus removed from the working surface to form successively a space 6 of atom or molecule unit on the workpiece 1 to a macro recess, thus carrying out strainless cutting, boring, grooving and so forth. Similarly in a strainless smoothing, the radical reaction may also take place most probably at a small portion projecting from the surface of the workpiece 1, consequently the projecting portion is removed selectively to smoothing on atom or molecule level.

Figure 2:
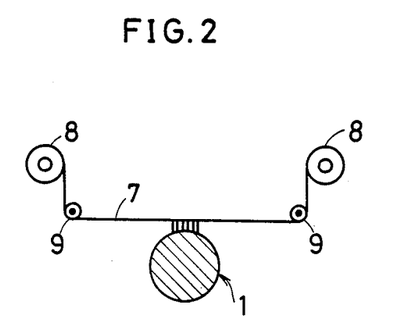
FIG. 2 is a simplified sectional view showing a cutting on discharge of a wire electrode.

FIG. 2 is a principle drawing of a device for strainless cutting by means of the radical 3 generated on a discharge of the workpiece 1, wherein a wire electrode 7 such as tungsten, platinum or the like is wound on feeding and take-up reels 8, 8 spaced apart from each other, the wire electrode 7 is laid apart a little from the workpiece 1 through a plurality of guide rollers 9, . . . , and in case the workpiece 1 is a conductor, a discharge is generated on a DC voltage or high frequency voltage impressed by a DC power or RF (high frequency) power (not indicated) between the workpiece 1 and the wire electrode 7 to activate the atmospheric gas 2 (not indicated), the space 6 is produced only in an area where the radical 3 is present as shown in FIG. 1 according to a radical reaction of the generated radical 3 with the constituent atom or molecule 4 of the workpiece 1, and further a distance between the wire electrode 7 and the workpiece 1 is changed relatively to cutting. Then, in case the workpiece 1 is an insulator, a discharge is generated on a high frequency voltage impressed on the wire electrode 7 to a radical reaction likewise. Here, the wire electrode 7 normally uses a fine wire severl $\mu$m to several ten $\mu$m in the precision process, therefore the reels 8 are rotated to have the wire wound on one side for feeding at all times, thereby preventing the wire electrode 7 from cutting due to a discharge at the identical portion. Further, the workpiece 1 and the wire electrode 7 are shifted relatively on computer control or other means available, and thus a radical reaction area is changed successively to cutting of the workpiece 1.

Figure 3:
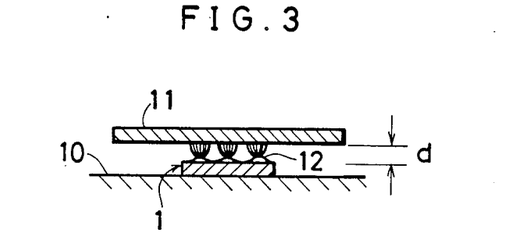
FIG. 3 is a simplified sectional view showing a smoothing on discharge of a lapped electrode.

FIG. 3 is a principle drawing of a device for smoothing the surface of the workpiece 1 by means of the radical 3 generated on discharge likewise, wherein a plane lapped electrode 11 is disposed in parallel and also at a small distance d over the plane workpiece 1 fixed on a surface plate 10, a DC or high frequency voltage is impressed between the lapped electrode 11 and the workpiece 1 according to the workpiece 1 being a conductor or an insulator, a discharge is thus caused to generate the radical 3, thereby removing the constituent atom or molecule 4 of the workpiece 1. Here, the discharge is generated selectively on a point effect between the lapped electrode 11 and the workpiece 1 at a salient 12 present on the surface of the workpiece 1, a removal of the constituent atom or molecule 4 on the radical reaction goes on at the portion, thus smoothing the surface of the workpiece 1. Then, the distance d between the lapped electrode 11 and the workpiece 1 may be optimized for gap by gap sensor or the like, thereby enhancing a working efficiency, and further the lapped electrode 11 and the workpiece 1 can be shifted relatively so as to minimize a damage due to discharge of the lapped electrode 11 and also to work the surface as wide as possible. Further, a curved surface of the workpiece 1 can also be smoothed by means of the lapped electrode 11 with a form according to the curved surface.

Figure 4:
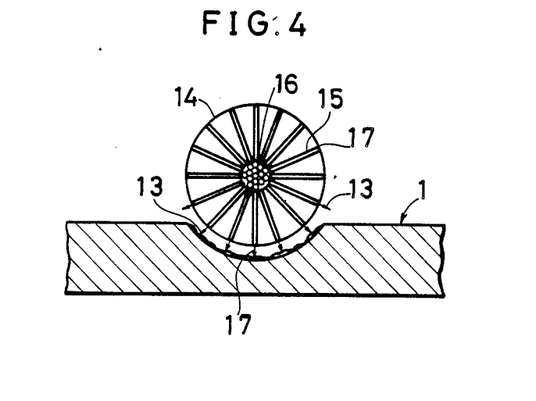
FIG. 4 is a simplified sectional view showing a cutting on excitation of radiated laser beams.
Figure 5:
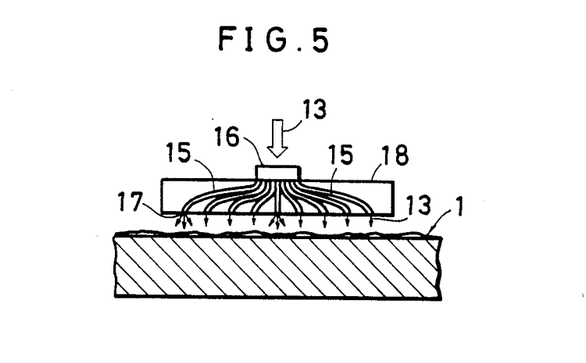
FIG. 5 is a simplified sectional view showing a smoothing on excitation of laser beams radiated evenly.

Still further, as shown in FIG. 4 and FIG. 5, the radical 3 is generated from exciting optically the atmospheric gas molecule 2 by laser beams 13 induced to a working portion of the workpiece 1, thereby realizing a strainless precision process. In FIG. 4, optical fibers 15 are buried in a disk wheel 14 radially and peripherally from the center, incident ports 16 of the laser beams 13 are formed intensively at the center, ejection ports 17, . . . are formed outwardly on the peripheral edge portion, the laser beams 13 are thus ready for irradiating on the gas molecule 2 present near the surface of the workpiece 1 from a peripheral edge of the wheel 14 disposed orthogonally to the surface of the workpiece 1, and the compound 5 produced on a radical reaction of the radical 3 generated by the laser beams 13 with the constituent atom or molecule 4 of the workpiece 1 is removed accordingly, thereby realizing a strainless cutting or grooving. Then, as shown in FIG. 5, the incident ports 16 of the laser beams 13 are formed intensively on one side of a plane lap plate 18, the ejection ports 17, . . . are formed in dispersion uniformly at predetermined intervals on the other side opposite to the workpiece 1, the incident ports 16 and the ejection ports 17, . . . are coupled optically through the optical fibers 15, . . . buried internally, the lap plate 18 is disposed a little apart from and in parallel with the workpiece 1, the laser beams 13 are irradiated to the gas molecule 2 near the surface of the workpiece 1, and thus the salient 12 present on the surface of the workpiece 1 is smoothed according to the radical reaction likewise. Here, an ejection angle of the laser beams 13 from the ejection ports 17 is large, and since a power density of the laser beams 13 deteriorates according as the distance from the lap plate 18 gets large, the constituent atom or molecule 4 at the salient 12 which is nearest to the lap plate 18 is removed, and thus the salient 12 is smoothed selectively as a result. Then, a continuous process may be realized likewise by shifting the wheel 14 or the lap plate 18 and the workpiece 1 relatively, and the wheel 14 is rotated to change a position for irradiating the laser beams 13 continuously, thereby obtaining an exceedingly uniform working plane. Then, a process on radical reaction for which an optical excitation of the laser beams 13 is utilized can be applied to various properties of the workpiece 1 irrespective of conductor or insulator. Further, for boring and grooving, a strainless precision process may be realized likewise according to a home position irradiation and scanning of focused laser beams.

Examples of various processes from utilizing the aforementioned working principle by discharge will further be described, next.

Figure 6:
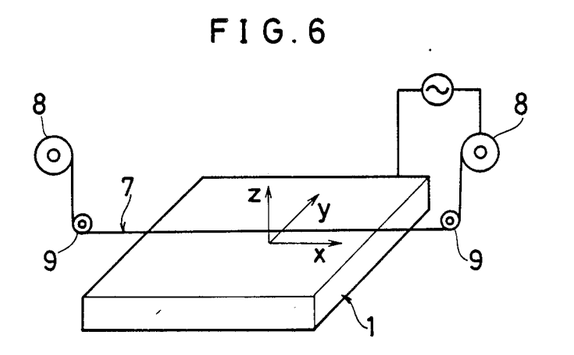
FIG. 6 is a simplified perspective view showing cutting and grooving by means of a wire electrode as in the case of FIG. 2.

FIG. 6 represents a cutting method as in the case of FIG. 2, wherein the wire electrode 7 disposed in parallel with the plane workpiece 1 is delivered in the direction X, the wire electrode 7 and the workpiece 1 are shifted relatively in the direction Z to cut the workpiece 1, and further shifted in the direction Y to cut or groove a new portion. Then, the cut face is flattened according to a linearity of the laid wire electrode 7.

Figure 7:
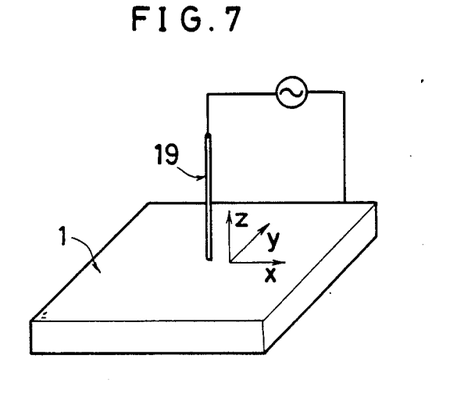
FIG. 7 is a simplified perspective view showing a boring by means of a needle electrode.

FIG. 7 represents a method for boring the workpiece 1 by shifting a needle electrode 19 kept orthogonal to the workpiece 1 with its tip disposed to come near thereto in the direction Z, and a method for grooving by shifting the needle electrode 19 or the workpiece 1 in the directions X and Y is further represented therein.

Figure 8:
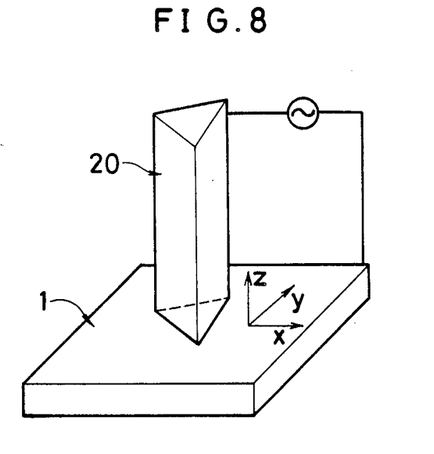
FIG. 8 is a simplified perspective view showing a transfer for transferring sectional form to a workpiece by means of a prismatic electrode.

FIG. 8 represents a working method or transferring method for forming a recess same in sectional form as a prismatic electrode 20 on the workpiece 1 by keeping the prismatic electrode 20 (triangular prism as indicated) having a predetermined sectional form orthogonal to the workpiece 1 and shifting it in the direction Z.

Figure 9:
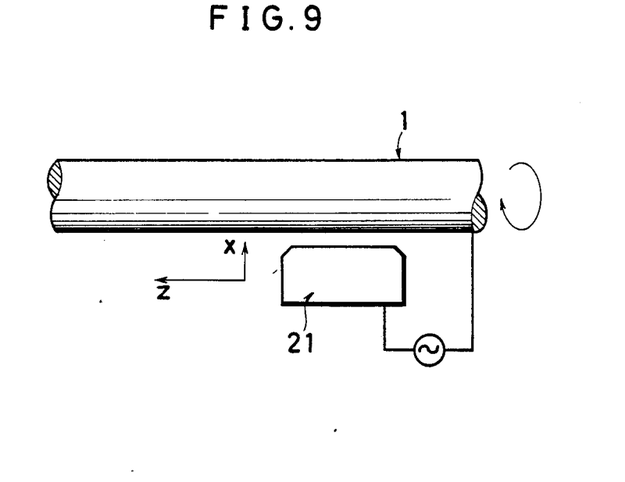
FIG. 9 is a simplified side view showing a smoothing of the outer peripheral surface of a columnar workpiece by means of a tool-like electrode.
Figure 10:
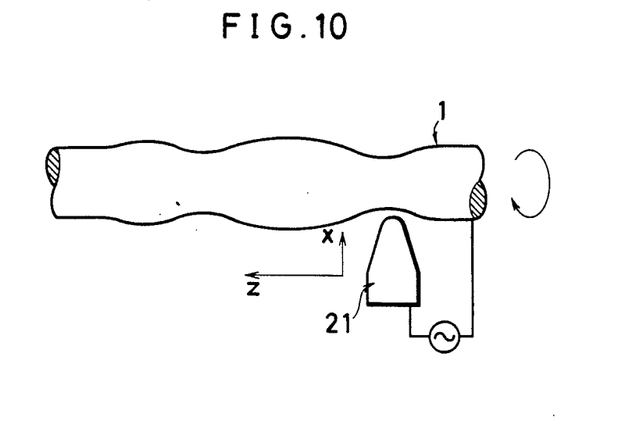
FIG. 10 is a simplified side view showing a smoothing for shaping the outer peripheral surface of a workpiece symmetrically in rotation by means of a tool-like electrode.
Figure 11:
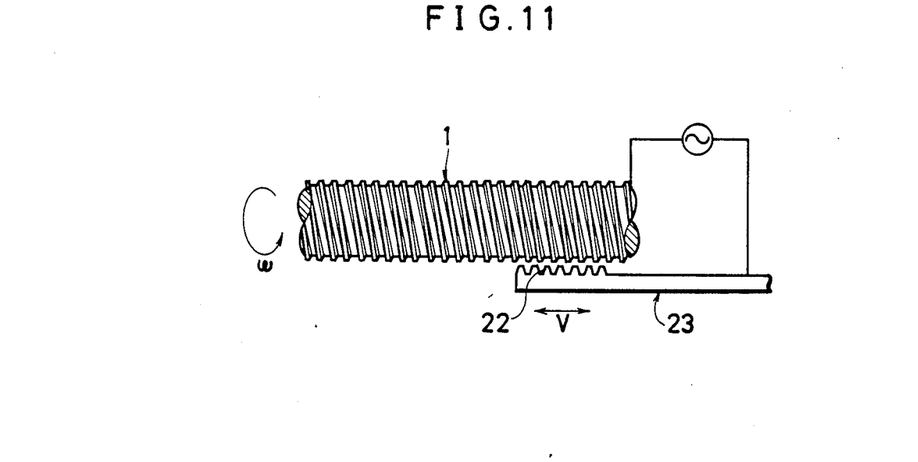
FIG. 11 is a simplified side view showing a threading of a cylindrical workpiece by means of a sawtooth electrode.

FIG. 9 to FIG. 11 represent a method for working the outer peripheral surface from rotating the workpiece 1 with a symmetrical form in rotation. FIG. 9 represents a method wherein a tool-like electrode 21 having a plane is disposed near the outer periphery of the cylindrical workpiece 1 in parallel therewith, the workpiece 1 is rotated, the tool-like electrode 21 is shifted axially or in the direction Z and further shifted in the direction X to have the interval adjusted accordingly, thus smoothing the outer peripheral surface of the workpiece 1, FIG. 10 represents a method wherein the outer peripheral surface of the workpiece 1 is smoothed likewise to an arbitrary symmetrical form in rotation by means of the tool-like electrode 21 with the nose almost pointed, and further FIG. 11 represents a method wherein a saw-tooth electrode 23 having projections 22, . . . arranged at regular intervals linearly is shifted axially at a velocity v in tune with a rotational angle speed $\omega$ of the workpiece 1, thereby threading the outer periphery of the workpiece 1.

Figure 12:
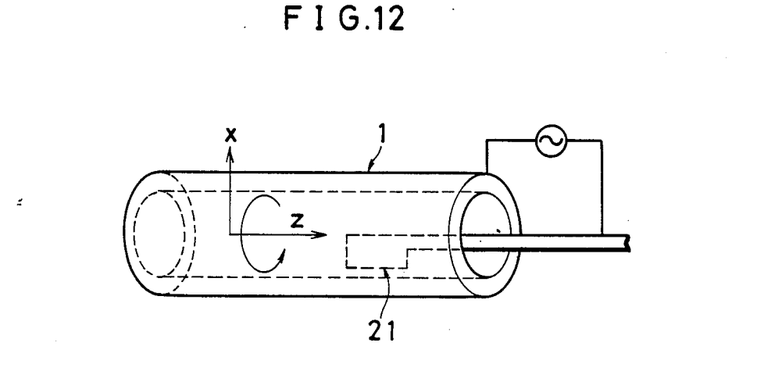
FIG. 12 is a simplified perspective view showing a smoothing of the inner peripheral surface of a cylindrical workpiece by means of a tool-like electrode.
Figure 13:
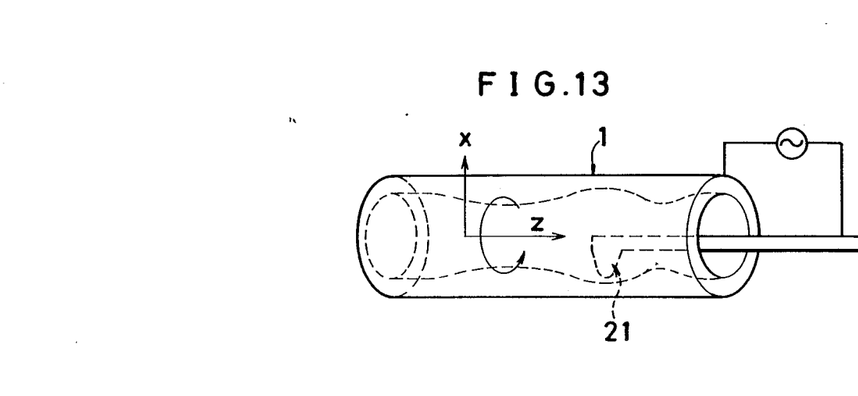
FIG. 13 is a simplified perspective view showing a smoothing for shaping the inner peripheral surface of a cylindrical workpiece symmetrically in rotation arbitrarily by means of a tool-like electrode.

FIG. 12 and FIG. 13 represent a method for working the inner peripheral surface from rotating the hollow workpiece 1 with a symmetrical form in rotation. FIG. 12 represents a method wherein the tool-like electrode 21 having a plane is disposed near the inner peripheral surface of the hollow cylindrical workpiece 1 in parallel therewith, the workpiece 1 is rotated, the tool-like electrode 21 is shifted axially or in the direction Z and further shifted in the direction X to have the interval adjusted accordingly, thus smoothing the inner peripheral surface of the workpiece 1, and FIG. 13 represents a method wherein the inner peripheral surface of the workpiece 1 is smoothed likewise to an arbitrary symmetrical form in rotation by means of the tool-like electrode 21 with the nose almost pointed.

Figure 14A:
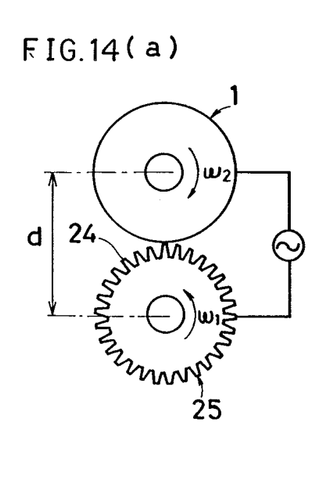
FIG. 14(a) shows a workpiece prior to cutting.
Figure 14B:
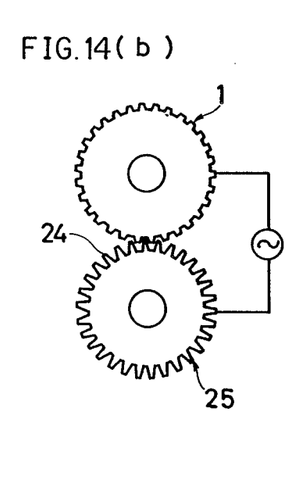
FIGS. 14(b) and (c) show workpieces after cutting when the workpieces are rotated at different angular velocities.
Figure 14C:
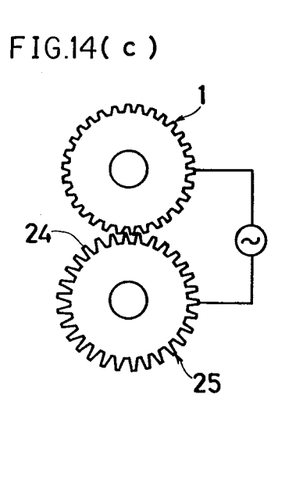

FIG. 14 represents a method wherein a gear-toothed electrode 25 having projections 24, . . . arranged at regular intervals on the outer periphery of a disk and the disk workpiece 1 are disposed with each outer periphery coming near and each shaft kept in the same direction, the gear-toothed electrode 25 is rotated in one direction at an angular velocity $\omega_1$, and the workpiece 1 is rotated reversely at an angular velocity $\omega_2$, thereby carrying out a gearcutting on the outer periphery of the workpiece 1. Here, a circular pitch of the gear teeth formed on the workpiece 1 can be set properly by adjusting the angular velocities $\omega_1$ and $\omega_2$.

Figures 15, 16:
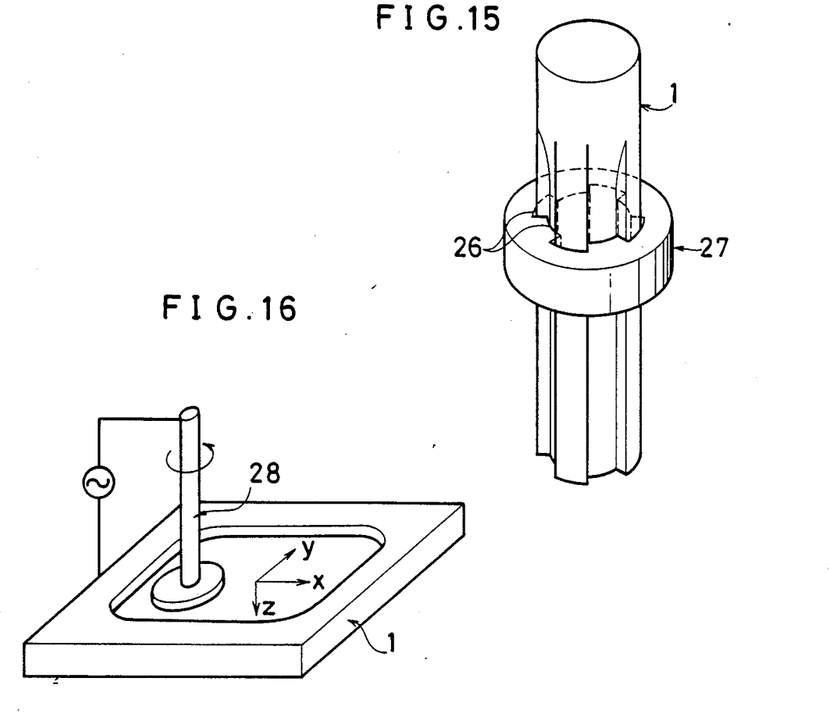
FIG. 15 is a simplified perspective view showing a transfer by means of a ring electrode as in the case of FIG. 8.
FIG. 16 is a simplified perspective view showing a reshaping by means of a correction electrode.

FIG. 15 represents a transfer similar to the working method shown in FIG. 8, wherein the cylindrical or prismatic workpiece 1 disposed within a ring electrode 27 with a proper shape of tongued-and-grooved face 26 necessary for working formed on the inner periphery is shifted axially, and thus a shape of the tongued-and-grooved face 26 is transferred axially on the outer peripheral surface of the workpiece 1, thereby transferring a sectional form of the ring electrode 27 to the workpiece 1.

FIG. 16 represents a method for reshaping a working face entirely as working a predetermined margin only at each point on the working face of the workpiece 1 by means of a correction electrode 28 having shape and size capable of correcting a local shape of the workpiece 1 on the nose. Then, the process corresponds to a process such as end milling or the like in a conventional milling.

Figure 17:
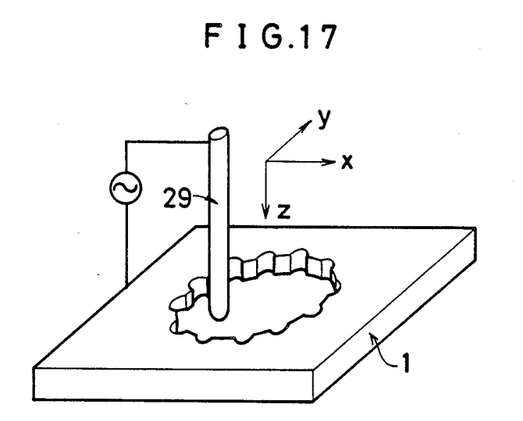
FIG. 17 is a simplified perspective view showing an arbitrary shaping by means of a rod electrode with a hemispherical surface on the nose.

FIG. 17 represents a method for working the workpiece 1 to a complicate shape by means of a rod electrode 29 with a hemispherical nose. The process corresponds to a conventional ball milling or the like.

As described, the invention comprises removing and so working the workpiece 1 on an atom or molecule level by the radical 3 generated in the atmospheric gas 2 through discharge or laser beam excitation, and an optimum condition must be set according to a material and area to work of the workpiece 1. In case, for example, a working is carried out on discharge, where pressure of the atmospheric gas 2 is low, the working may proceed slowly in a large area as the discharge covers an extensive range, which is suitable to smoothing, but where the pressure is high, the working may proceed efficiently and locally as the discharge is limited and thus the radical 3 may be generated at high probability, which is suitable to cutting by the wire electrode 7 and also to boring by the needle electrode 19. Then, the atmospheric gas 2 optimized to a material of the workpiece 1 must be selected, and further it is necessary to heat the workpiece 1 to such temperature as will not cause a thermal denaturation according to temperature easy to cause a radical reaction of the generated radical 3 with the constituent atom or molecule 4 and also to a vaporization temperature of the compound 5 produced on the radical reaction. For example, if a silicon single crystal used best for semiconductor element material is selected as the workpiece 1, then chloride gas is employed normally as the atmospheric gas 2, a radical reaction is caused at relatively low temperature, a sublimable silicon chloride is produced, and the silicon chloride can be vaporized at ordinary temperature or at 200° C. or below.

According to the strainless precision process on radical reaction of the invention described as above, a gas is activated selectively on discharge or laser beam excitation in the vicinity of a workpiece disposed in a gaseous atmosphere, a compound produced on a radical reaction with a constituent atom or molecule of the workpiece is vaporized, therefore a working contactless in principle may be effected, and hence a strainless process totally free from residual defect and thermally affected layer such as crack and the like which cannot be avoided with the prior art process using a brittle fracture by fine cracks and thus deteriorate a reliability of the working face most probably may be realized, a reliability of products can sharply be enhanced, and since the process comprises removing the workpiece on a constituent atom or molecule level, an exceedingly fine portion can be processed in precision simply in principle, and further the workpiece will never be damaged, therefore an after-treatment whereby a cut face is removed by 100 μm or over in thickness hitherto is no more required, and thus not only the post-process is so simplified, but also materials can be utilized effectively. While the strainless precision process according to the invention is so efficient as described above, it is quite simple that a reactive radical is generated by activating selectively a gas in the vicinity of the working portion of a workpiece disposed in a gaseous atmosphere through discharge or laser beam excitation, a compound produced on a radical reaction of the radical with an atom or molecule constituting the workpiece is vaporized spontaneously or by heating not to denature the workpiece and then removed from the working portion, thereby realizing a precision process such as strainless cutting, smoothing, boring, grooving and so forth.

What is claimed is:

1. A stainless precision process for processing a workpiece using free radicals consisting essentially of:
    disposing the workpiece to be processed a little apart from a disk wheel or a plane lap plate and in an atmosphere of a gas capable of forming free radicals reactive with atoms or molecules of the workpiece to form a volatile compound with said atoms or molecules, said disk wheel or plane lap plate containing therein an optical fiber capable of transmitting a laser beam between an incident port in said disk wheel or plane lap plate and an ejection port in said disk wheel or plane lap plate opposite the workpiece; and rotating the disk wheel or moving the plane lap plate relative to the workpiece, while irradiating the workpiece with a laser beam transmitted by the optical fiber from said incident port to said ejection port, thereby forming free radicals and processing the workpiece.

2. A stainless precision process for cutting a workpiece using free radicals consisting essentially of:
    disposing the workpiece to be cut a little apart from a wire electrode and in an atmosphere of a gas capable of forming free radicals reactive with atoms or molecules of the workpiece to form a volatile compound with said atoms or molecules; and
    impressing a high frequency voltage on the electrode when the workpiece is an insulator, or impressing a DC voltage or a high frequency voltage on the electrode when the workpiece is a conductor, while moving the workpiece and the electrode relative to each other, to generate a discharge between the electrode and the workpiece, thereby forming free radicals which cut the workpiece.

3. A stainless precision process for smoothing a workpiece using free radicals consisting essentially of:
    disposing the workpiece to be smoothed a little apart from a lapped electrode having a plane or curved surface and in an atmosphere of a gas capable of forming free radicals reactive with atoms or molecules of the workpiece to form a volatile compound with said atoms or molecules; and
    impressing a high frequency voltage on the electrode when the workpiece is an insulator, or impressing a DC voltage or a high frequency voltage on the electrode when the workpiece is a conductor, while moving the workpiece and the electrode relative to each other, to generate a discharge between the electrode and the workpiece, thereby forming free radicals which smooth the workpiece.

4. A stainless precision process for boring a workpiece using free radicals consisting essentially of:
    disposing the workpiece to be bored a little apart from a needle-shaped electrode and in an atmosphere of a gas capable of forming free radicals reactive with atoms or molecules of the workpiece to form a volatile compound with said atoms or molecules; and
    impressing a high frequency voltage on the electrode when the workpiece is an insulator, or impressing a DC voltage or a high frequency voltage on the electrode when the workpiece is a conductor, while moving the workpiece and the electrode relative to each other, to generate a discharge between the electrode and the workpiece, thereby forming free radicals which bore the workpiece.

5. A stainless precision process for imparting a prismatic, ring or sectional shape to the workpiece using free radicals consisting essentially of:
- disposing the workpiece to be processed a little apart from an electrode having said shape and in an atmosphere of a gas capable of forming free radicals reactive with atoms or molecules of the workpiece to form a volatile compound with said atoms or molecules; and
- impressing a high frequency voltage on the electrode when the workpiece is an insulator, or impressing a DC voltage or a high frequency voltage on the electrode when the workpiece is a conductor, while moving the workpiece and the electrode relative to each other, to generate a discharge between the electrode and the workpiece, thereby forming free radicals which impart said shape to the workpiece.

6. A strainless precision process for smoothing the surface of a cylindrically shaped workpiece using free radicals consisting essentially of:
- disposing the workpiece to be smoothed a little apart from a tool-like electrode and in an atmosphere of a gas capable of forming free radicals reactive with atoms or molecules of the workpiece to form a volatile compound with said atoms or molecules; and
- impressing a high frequency voltage on the electrode when the workpiece is an insulator, or impressing a DC voltage or a high frequency voltage on the electrode when the workpiece is a conductor, while rotating the workpiece about its axis and moving the electrode axially to the workpiece to generate a discharge between the electrode and the workpiece, thereby forming free radicals which smooth the surface of the workpiece.

7. A strainless precision process for threading a cylindrically shaped workpiece using free radicals consisting essentially of:
- disposing the workpiece to be processed a little apart from a saw-tooth shaped electrode having projections arranged linearly thereon and in an atmosphere of a gas capable of forming free radicals reactive with atoms or molecules of the workpiece to form a volatile compound with said atoms or molecules; and
- impressing a high frequency voltage on the electrode when the workpiece is an insulator, or impressing a DC voltage or a high frequency voltage on the electrode when the workpiece is a conductor, while rotating the workpiece about its axis and moving the electrode axially to the workpiece, to generate a discharge between the electrode and the workpiece, thereby forming free radicals which thread the workpiece.

8. A strainless precision process for imparting a gear-shape to a workpiece using free radicals consisting essentially of:
- disposing the workpiece to be processed a little apart from a gear-toothed shaped electrode having projections arranged at regular intervals on an outer periphery of a disk and in an atmosphere of a gas capable of forming free radicals reactive with atoms or molecules of the workpiece to form a volatile compound with said atoms or molecules; and
- impressing a high frequency voltage on the electrode when the workpiece is an insulator, or impressing a DC voltage or a high frequency voltage on the electrode when the workpiece is a conductor, while rotating the workpiece and the electrode in opposite directions relative to each other, to generate a discharge between the electrode and the workpiece, thereby forming free radicals which impart a gear-shape to the workpiece.

9. A strainless precision process for shaping a workpiece to a predetermined shape using free radicals consisting essentially of:
- disposing the workpiece to be processed a little apart from a rod-shaped electrode and in an atmosphere of a gas capable of forming free radicals reactive with atoms or molecules of the workpiece to form a volatile compound with said atoms or molecules; and
- impressing a high frequency voltage on the electrode when the workpiece is an insulator, or impressing a DC voltage or a high frequency voltage on the electrode when the workpiece is a conductor, while moving the workpiece and the electrode relative to each other, to generate a discharge between the electrode and the workpiece, thereby forming free radicals which impart the predetermined shape to the workpiece.

* * * * *

UNITED STATES PATENT AND TRADEMARK OFFICE
CERTIFICATE OF CORRECTION

PATENT NO. : 4,960,495

DATED : October 2, 1990

INVENTOR(S) : Yuzo MORI et al.

It is certified that error appears in the above-identified patent and that said Letters Patent is hereby corrected as shown below:

On the cover page, Item [73], "Mikakto Precision Engineering Research Institute Co., Ltd." should read --Mikakto Precision Engineering Research Institute Co., Ltd., from Kazuto Yamauchi--. Part interest.

Signed and Sealed this

Twenty-sixth Day of May, 1992

Attest:

DOUGLAS B. COMER

Attesting Officer

Acting Commissioner of Patents and Trademarks

UNITED STATES PATENT AND TRADEMARK OFFICE
CERTIFICATE OF CORRECTION

PATENT NO.: 4,960,495
DATED : 10/2/90
INVENTOR(S): YUZO MORI et al.

It is certified that error appears in the above-identified patent and that said Letters Patent is hereby corrected as shown below:

Claims 1, 2, 3, 4 and 5, line one of each, "stainless" should read --strainless--.

Signed and Sealed this

Nineteenth Day of July, 1994

Attest:

BRUCE LEHMAN

*Attesting Officer*  *Commissioner of Patents and Trademarks*